United States Patent
Chan et al.

(10) Patent No.: US 7,930,162 B1
(45) Date of Patent: Apr. 19, 2011

(54) ACCELERATING HARDWARE CO-SIMULATION USING DYNAMIC REPLAY ON FIRST-IN-FIRST-OUT-DRIVEN COMMAND PROCESSOR

(75) Inventors: Chi Bun Chan, San Jose, CA (US);
Shay Ping Seng, San Jose, CA (US);
Jingzhao Ou, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 528 days.

(21) Appl. No.: 12/115,340

(22) Filed: May 5, 2008

(51) Int. Cl.
*G06F 17/50* (2006.01)
(52) U.S. Cl. .......................................... 703/14; 714/724
(58) Field of Classification Search ...................... 703/14
See application file for complete search history.

(56) References Cited

U.S. PATENT DOCUMENTS

| | | | |
|---|---|---|---|
| 5,339,262 A | 8/1994 | Rostoker et al. | |
| 5,371,878 A | 12/1994 | Coker | |
| 5,394,544 A | 2/1995 | Motoyama et al. | |
| 5,546,562 A | 8/1996 | Patel | |
| 5,678,003 A | 10/1997 | Brooks | |
| 5,692,147 A | 11/1997 | Larsen et al. | |
| 5,794,033 A | 8/1998 | Aldebart et al. | |
| 5,841,792 A | 11/1998 | Kawano et al. | |
| 6,023,565 A | 2/2000 | Lawman et al. | |
| 6,173,419 B1 | 1/2001 | Barnett | |
| 6,347,368 B1 | 2/2002 | Harthcock | |
| 6,483,342 B2 | 11/2002 | Britton et al. | |
| 6,587,979 B1 | 7/2003 | Kraus et al. | |
| 6,654,934 B1 | 11/2003 | Nemecek et al. | |
| 6,744,388 B1* | 6/2004 | Khu | 341/51 |
| 6,747,911 B2 | 6/2004 | Roohparvar | |
| 7,149,640 B2* | 12/2006 | Lawrence et al. | 702/108 |
| 7,653,848 B2* | 1/2010 | Abernathy et al. | 714/724 |
| 2001/0023490 A1 | 9/2001 | Gloeckler et al. | |
| 2002/0065646 A1 | 5/2002 | Waldie et al. | |
| 2003/0061020 A1 | 3/2003 | Michael | |
| 2003/0163798 A1 | 8/2003 | Hwang et al. | |
| 2004/0236556 A1 | 11/2004 | Lin | |
| 2006/0255972 A1* | 11/2006 | Swoboda | 341/50 |
| 2010/0223237 A1* | 9/2010 | Mishra et al. | 707/693 |

OTHER PUBLICATIONS

Karimi et al, "Data Compression for System-on-Chip Testing Using ATE", Proceedings of the 17th IEEE International Symposium on Defect and Fault Tolerance in VLSI Systems, 2002.*
Namba et al, "Interleaving of Delay Fault Test Data for Efficient Test Compression with Statistical Coding", 15th Asian Test Symposium, 2006.*

(Continued)

*Primary Examiner* — Mary C Jacob
(74) *Attorney, Agent, or Firm* — Kevin T. Cuenot

(57) ABSTRACT

An integrated circuit configured for hardware co-simulation can include a command processor, a replay buffer storing a command template, wherein the command template specifies an incomplete command, and a command first-in-first out (FIFO) memory storing complementary data for completion of the command template. The integrated circuit further can include a multiplexer coupled to the command processor, the replay buffer, and the command FIFO. The multiplexer, under control of the command processor, can selectively provide data from the replay buffer or the command FIFO to the command processor. The command processor, responsive to a replay command read during a hardware co-simulation session, can enter a replay mode, obtain the command template from the replay buffer, obtain the complementary data from the FIFO memory according to a symbol read from the command template, and form a complete command by joining the command template with the complementary data.

20 Claims, 5 Drawing Sheets

OTHER PUBLICATIONS

Mayer et al, "Boosting Debugging Support for Complex Systems on Chip", Computer, Apr. 2007, vol. 40, Issue 4, pp. 76-81.*

Rajski et al, "Embedded Deterministic Test for Low Cost Manufacturing Test", ITC International Test Conference, 2002.*

U.S. Appl. No. 11/314,486, filed Dec. 21, 2005, Ballagh et al.

Xilinx, Inc., *Using a Microprocessor to Configure Xilinx FPGAs via Slave Serial or SelectMAP Mode*, XAPP502 (v1.5), Dec. 3, 2007, pp. 1-15, available from Xilinx, Inc., 2100 Logic Drive, San Jose, California 95124, USA.

Xilinx, Inc., "Virtex-4 Configuration Guide (v.1.1)," UG071, Sep. 10, 2004, pp. 1-108, available from Xilinx, Inc., 2100 Logic Drive, San Jose, California 95124, USA.

Xilinx, Inc., "Virtex-4 User Guide (v.1.3)," UG070, Apr. 11, 2005, pp. 1-383, available from Xilinx, Inc., 2100 Logic Drive, San Jose, California 95124, USA.

Tanenbaum, Andrew S., *Structured Computer Organization*, 1994, pp. 10-12, Prentice Hall, Englewood Cliffs, New Jersey, USA.

* cited by examiner

US 7,930,162 B1

ACCELERATING HARDWARE CO-SIMULATION USING DYNAMIC REPLAY ON FIRST-IN-FIRST-OUT-DRIVEN COMMAND PROCESSOR

FIELD OF THE INVENTION

The embodiments disclosed herein relate to integrated circuit devices. More particularly, the embodiments relate to testing circuit designs for implementation within integrated circuit devices using hardware co-simulation.

BACKGROUND OF THE INVENTION

Hardware co-simulation refers to a technique for testing circuit designs, or portions thereof, implemented within an integrated circuit such as a programmable logic device (PLD). Typically, a PLD is utilized as a test platform within which the circuit design, or some portion thereof, is implemented. For example, the PLD may be mounted on a circuit board that is communicatively linked with a host computing system through a communication channel. The host computing system (host) can execute simulation software that can interact with the PLD and the circuit design, referred to as the "design under test" or "DUT," implemented within the PLD.

To facilitate hardware co-simulation, a hardware co-simulation interface (HWCIF) is implemented within the PLD in conjunction with the DUT. The HWCIF supports interaction between the host and the DUT. Typically, the host communicates with the DUT through a memory map. The memory map associates each input/output port of the DUT with a particular memory address. Data can be provided to a selected port of the DUT by writing to the memory address of the memory map that corresponds to the selected port. Data can be obtained from a selected port of the DUT by reading from the memory address of the memory map that corresponds to the selected port.

The host can initiate a read or a write operation with respect to the DUT by issuing commands to the PLD via the communication channel. The HWCIF can translate the received commands into appropriate operations that are understandable by the DUT. The HWCIF further can perform the inverse function with respect to data obtained from the DUT to be provided back to the host.

Modern computer systems and PLDs typically offer sufficient computing power to quickly and efficiently perform their roles within the context of hardware co-simulation. The amount of data that is transferred between the host and the PLD, however, can be significant. Implementing a communication protocol over the communication channel can introduce further overhead. For example, processes such as setting up and tearing down data transfers, packetization, routing, synchronization, and the like may require further time and require additional data to be exchanged over the communication channel apart from the actual test data and test results. It is often the case that the communication channel, suffering from limited bandwidth, latency, congestion, or the like, is the bottleneck within the hardware co-simulation system.

SUMMARY OF THE INVENTION

The embodiments disclosed herein relate to hardware co-simulation. One embodiment of the present invention can include an integrated circuit (e.g., a programmable logic device (PLD)) configured for hardware co-simulation. The integrated circuit can include a command processor and a replay buffer storing at least one command template, wherein each command template specifies an incomplete command. The replay buffer can be implemented as a random access memory. The integrated circuit also can include a command first-in-first out (FIFO) memory storing complementary data for completion of the command template.

The integrated circuit further can include a multiplexer coupled to the command processor, the replay buffer, and the command FIFO. The multiplexer, under control of the command processor, can selectively provide data from the replay buffer or the command FIFO to the command processor. Responsive to a replay command read during a hardware co-simulation session, the command processor can enter a replay mode, obtain the command template from the replay buffer, obtain the complementary data from the FIFO memory according to a symbol read from the command template, and form a complete command by joining the command template with the complementary data.

The command processor can advance a read memory address of the replay buffer after reading a command template from the replay buffer. The command processor, responsive to reading a jump command within the replay buffer, can set a read memory address of the replay buffer to a memory address specified by the jump command. Responsive to receiving a program command from a host data processing system (host) during the hardware co-simulation session, the command processor can store at least one command template specified by the program command beginning at a memory address of the replay buffer that is specified by the program command.

The command processor can identify the symbol according to a parity bit and retrieve a number of data items specified by the symbol from the command FIFO. The command processor, responsive to determining that the symbol specifies that no data is to be obtained from the command FIFO, can exit replay mode and enter normal mode, wherein a next command to be read during hardware co-simulation is read from the command FIFO.

In the event that the command processor receives out-of-band signals, the command processor, responsive to receiving an out-of-band signal, can enter normal mode, wherein a next command to be read during hardware co-simulation is read from the command FIFO.

Another embodiment of the present invention can include a computer-implemented method of performing hardware co-simulation using an integrated circuit (e.g., a PLD) and the host. The computer-implemented method can include, prior to starting a hardware co-simulation session, identifying recurring data that is to be sent from the host to the integrated circuit and programming a replay buffer within the integrated circuit with at least one command template generated from the recurring data. Each command template can be an incomplete command. The computer-implemented method further can include, during the hardware co-simulation session and responsive to detecting a replay command from the host, reading the command template from the replay buffer and at least one data item from a command FIFO. A complete command can be formed by joining the command template and the data item. The complete command can be output.

Identifying recurring data can include identifying at least one of an op-code or an operand that is to be sent from the host to the DUT more than one time during the hardware co-simulation session. The computer-implemented method also can include loading at least one new command template into the replay buffer during the hardware co-simulation session. Loading at least one new command template can include receiving a program command from the host during the hardware co-simulation session and storing a command template specified by the program command beginning at a memory address of the replay buffer that is specified by the program command.

Reading the command template from the replay buffer and at least one data item from a command FIFO memory can include identifying a symbol within the command template according to a parity bit and retrieving a number of data items from the command FIFO as specified by the symbol. Reading the command template from the replay buffer and at least one data item from a command FIFO memory also can include identifying a symbol within the command template according to a parity bit, determining that the symbol specifies a value of zero, and responsive to determining that the symbol specifies a value of zero, exiting replay mode and entering normal mode. Accordingly, a next command to be executed can be read from the command FIFO.

Yet another embodiment of the present invention can include a computer program product including a computer-usable medium having computer-usable program code that, when executed by a data processing system, causes the data processing system to perform the various steps and/or functions disclosed herein. Execution of the computer-usable program code further can instantiate the various circuit structures disclosed herein within an integrated circuit, e.g., a PLD.

DETAILED DESCRIPTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the invention.

The embodiments disclosed herein relate to hardware co-simulation involving a host computing system (host) and a programmable logic device (PLD). As known, hardware co-simulation generally refers to a process in which a circuit design, or some portion thereof, referred to as the design under test (DUT), is implemented within the PLD. The host, executing simulation software, can communicate with the PLD to conduct testing and evaluation of the DUT.

In accordance with the inventive arrangements disclosed herein, a PLD can be configured with a hardware co-simulation interface that includes a replay mechanism. The replay mechanism can exploit repeating or recurring patterns of data found in the hardware co-simulation data to be provided to the DUT. The recurring data can be preloaded into the replay mechanism so that during a hardware co-simulation session, the preloaded data can be retrieved from the replay mechanism. By replaying this information, the need to send the data from the host to the PLD over the communication channel multiple times can be reduced or avoided. By reducing the amount of data transferred between the host and the PLD during a hardware co-simulation session, the speed and efficiency of hardware co-simulation can be increased.

Figure 1:
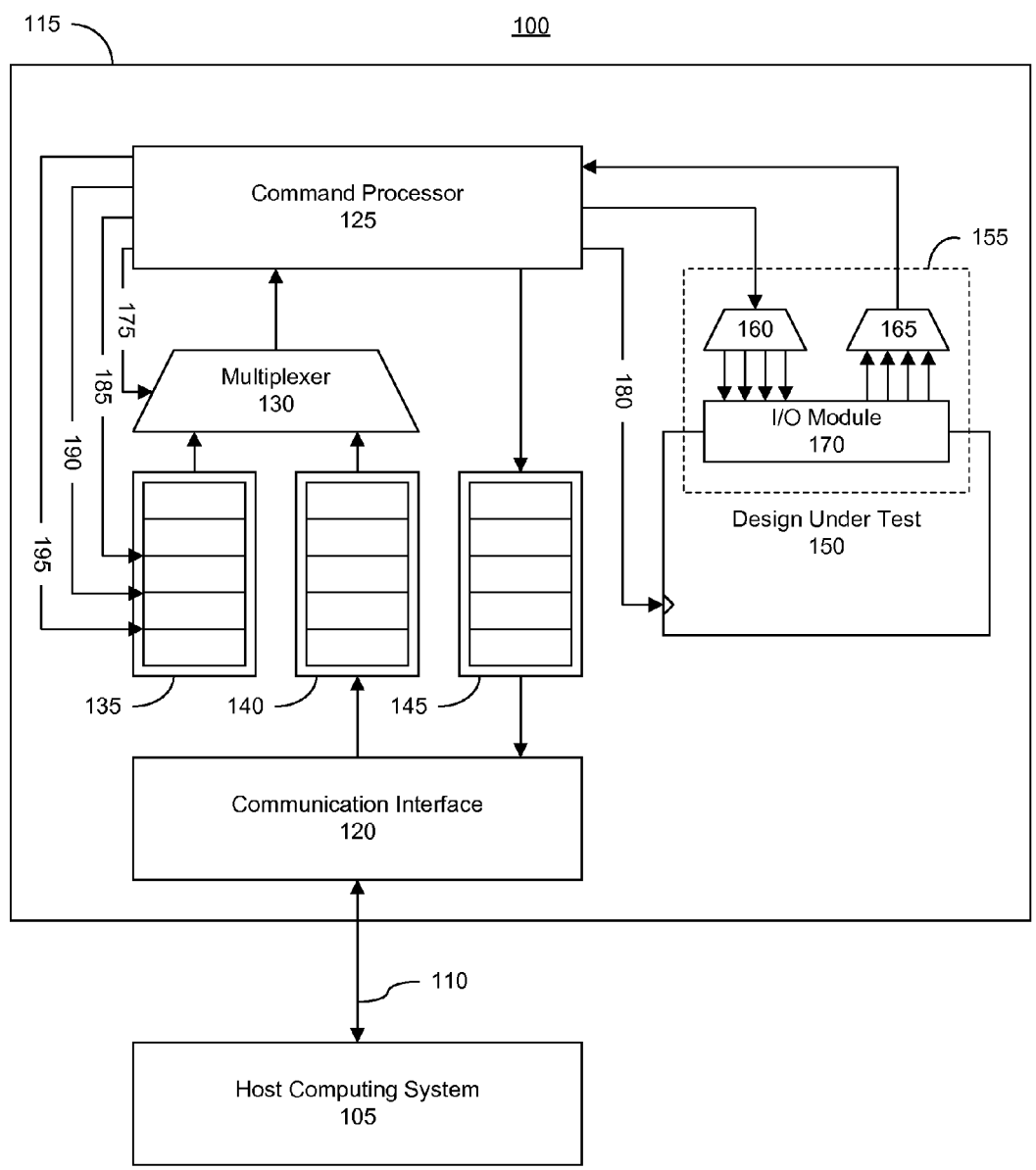
FIG. 1 is a schematic diagram illustrating a system for hardware co-simulation in accordance with one embodiment of the present invention.

FIG. 1 is a schematic diagram illustrating a system 100 for hardware co-simulation in accordance with one embodiment of the present invention. As pictured, the system 100 can include a host 105, a communication channel 110, and a PLD 115. The host 105 can be implemented as any of a variety of data processing systems. A data processing system, e.g., a computer system, laptop, server, or the like, suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices such as, for example, keyboards, displays, pointing devices, etc., can be coupled to the data processing system either directly or through intervening I/O controllers. Network adapters may also be coupled to the data processing system to enable the data processing system to become coupled to other data processing systems or remote printers or storage devices through intervening private or public networks. Modems, cable modems, and Ethernet cards are just a few of the currently available types of network adapters.

The host 105 can include simulation software (not shown), which, when executed, allows the host 105 to output, e.g., send, data to the PLD 115 as well as receive data that is output from the PLD 115. As used herein, "outputting" and/or "output" can mean, for example, writing to a file, writing to a user display or other output device, playing audible notifications, sending or transmitting to another system, exporting, or the like.

The host 105 can write data to particular ports of a DUT 150 within the PLD 115 to stimulate the DUT 150, can read data (results) from particular ports of the DUT 150, and can control clock advancement of the DUT 150. Such operations can be controlled by sending data, e.g., commands, to the PLD 115 and by receiving result data from the PLD 115 via the communication channel 110. The host 105 further can execute one or more simulation models in a complementary manner with the operation of a DUT 150, if so desired.

The communication channel 110 can communicatively link the host 105 with the PLD 115. It should be appreciated that the PLD 115 can be disposed within a test platform, e.g., a circuit board, having a suitable network interface or connection. Accordingly, the communication channel 110 can be coupled to a network adapter of the host 105 and a network interface of the test platform upon which the PLD 115 is disposed. The communication channel 110 can be implemented, for example, as a Peripheral Connect Interface (PCI) communication link, a Personal Computer Memory Card International Association (PCMCIA) communication link, a Joint Test Action Group (JTAG) communication link, a Universal Serial Bus (USB) communication link, an Ethernet communication link, or the like.

The PLD 115 can be implemented as, for example, a Field Programmable Gate Array (FPGA), a Complex Programmable Logic Device (CPLD), a Programmable Logic Array (PLA), a Programmable Array Logic (PAL) device, or a mask programmable device. PLD 115 can also be implemented in other ways, e.g., using fuse or antifuse technology. Accordingly, the terms "PLD" and "programmable logic device," as used herein, can include, but are not limited to, these exemplary devices, as well as encompassing devices that are only partially programmable. For instance, one type of PLD includes a combination of hard-coded transistor logic and a programmable switch fabric that programmably interconnects the hard-coded transistor logic.

The PLD 115 can include a communication interface 120, a command processor 125, a multiplexer 130, a replay buffer 135, a command first-in-first-out (FIFO) 140 memory (command FIFO 140), and a result FIFO 145. In addition, the PLD 115 can include the DUT 150 and a memory map interface 155. The memory map interface 155 can include multiplexers 160 and 165 as well as an I/O module 170.

The communication interface 120 can perform the processing functions necessary for sending data from the PLD 115 to the host 105 and for receiving data from the host 105 to the PLD 115. For example, the communication interface 120 can perform functions such as data encoding, decoding, packatization, de-packetization, synchronization, and the like, according to the requirements of the particular communication channel 110 that is used.

As shown, the communication interface 120 can be coupled to the command FIFO 140 and the result FIFO 145. The command FIFO 140 can be a first-in-first-out type memory that serves as a source of information for the command processor 125. The result FIFO 145 also can be implemented as a first-in-first-out memory. The result FIFO 145 can receive data that is output from the DUT 150 via the command processor 125.

The replay buffer 135 can be implemented as a random access memory (RAM). Like the command FIFO 140, the replay buffer 135 can serve as a source of information for the command processor 125. The replay buffer 135, however, is loaded with data by the command processor 125. That is, data to be populated within the replay buffer 135 is received through the command FIFO 140. The command processor 125 can read the data from the command FIFO 140 and write the data to the replay buffer 135.

The command processor 125 can send control signals via control line 175 to the multiplexer 130. Responsive to those control signals, the multiplexer 130 can selectively pass data from the replay buffer 135 or the command FIFO 140. Accordingly, the command processor 125 can receive data from the replay buffer 135 and/or the command FIFO 140. The command processor 125 can execute any commands specified by the received data by performing the specified actions with respect to the DUT 150 or the replay buffer 135.

As shown, the command processor 125 is communicatively linked with the replay buffer 135 via signals 185, 190, and 195. Signal 185 can be an addressing line that selects a particular address within the replay buffer from which data is read or to which data is written. Signal 190 can be a data line through which data is provided, e.g., written, to the replay buffer 135. Signal 195 can be a write enable signal that allows new data to be written into the replay buffer 135 during the replay buffer programming process. As noted, data read from the replay buffer 135 by the command processor 125 can occur through the multiplexer 130 per signals passed via control line 175.

The command processor 125 can communicate with the memory map interface 155. The command processor can write data to the DUT 150 via the memory map interface 155 and read data that is output from the DUT 150 from the memory map interface 155. More particularly, the command processor 125 can drive multiplexer 160 with the information needed to write to the selected memory addresses in the I/O module 170. The I/O module 170 can be implemented as a random access memory. Writing to selected memory addresses effectively writes data to the ports of the DUT 150 that are associated with the selected memory addresses of the I/O module 170. Similarly, data generated by the DUT 150 can be written by the DUT 150 to selected memory addresses of the I/O module 170 to emulate data being output on ports corresponding to the selected memory addresses. The command processor 125 can read those memory addresses (e.g., ports) via multiplexer 165. As shown, the command processor 125 further can provide a clock signal 180 to the DUT 150.

In operation, the host 105, executing a simulation program, can be configured with a particular sequence of commands to be provided to the DUT 150. A "command," as used herein, can refer to an atomic unit that includes an instruction, e.g., an opcode, and optionally one or more operands. For example, the structure of a command can be represented as <opcode><operand>. Commands can be organized into a "command sequence," which can be a group of one or more commands having a specified order.

The particular command sequence to be provided to the DUT 150 during a hardware co-simulation session will be known before the start of that hardware co-simulation session. Accordingly, prior to beginning the hardware co-simulation session, the host 105 can identify any repeating or recurring data patterns. That is, the host 105 can identify any repeating and/or recurring commands, command sequences, or portions of commands, e.g., opcodes and/or operands, from the data that will be provided to the DUT 150 during an as yet unstarted, but identified, hardware co-simulation session. Any data that is identified as recurring can be preloaded into the replay buffer 135 in the form of one or more command templates prior to the start of the hardware co-simulation session.

For example, consider the case where DUT 150 includes an input port A corresponding to memory address 100 of the memory map interface 155, an input port B corresponding to memory address 102, and an input port C corresponding to memory address 101. The DUT 150 further can include an output port X corresponding to memory address 200 and an output port Y corresponding to a memory address 201. At each cycle of the hardware co-simulation session, a data item can be given to each input port of the DUT 150. Similarly, a data item can be read from each output port of the DUT 150. At clock cycle "n" of the hardware co-simulation session, a command sequence such as:

Write 100, 1, $a_n$
Write 102, 1, $b_n$
Write 101, 1, $c_n$
Read 200, 1
Read 201, 1
Run 1 can be sent from the host 105 to the PLD 115.

In this example, the "Write" command has a structure of <Write opcode><memory address operand>, <length operand>, <data item operand>. The "Read" command has a structure of <Read opcode><memory address operand>, <length operand>. In this example, the command sequence includes several repeated opcodes, e.g., three "Write" opcodes and two "Read" opcodes. The length operand with a value 1 is repeated five times. The variables $a_n$, $b_n$, $c_n$ represent data items to be written to ports A, B, and C respectively at the $n^{th}$ clock cycle.

Prior to the start of a hardware co-simulation session, the host 105 can identify redundant data that will be sent from the host 105 to the PLD 115. For example, the host 105 can identify the fact that, for a given hardware co-simulation session, the "Write" opcode will be sent three times, the "Read" opcode will be sent two times, and the same value for the length operand will be sent five times. The host 105 can identify situations in which a same opcode and/or operand (e.g., same value of an operand) will be sent more than one time during a same hardware co-simulation session. Further patterns of repeated commands, portions of commands, and/or command sequences can be identified.

The data that is identified as being redundant can be preloaded into the replay buffer 135 in the form of one or more command templates. Each command template can specify one or more items of information needed to form a command. Each command template, however, can specify an incomplete command. For example, a command template can specify an opcode, an operand, or various combinations thereof. That is, a command template can be viewed as a command fragment in which either an operand or one or more operands is needed to form a complete command. The data needed to complete each command template will be sent from the host 105 and loaded into the command FIFO 140 during the hardware co-simulation session.

The sending of data to the command FIFO 140 during the hardware co-simulation session can be coordinated with respect to the command templates that are preloaded into the replay buffer 135. Accordingly, the command processor 125, responsive to receiving selected instructions from the host 105, can read from the replay buffer 135 or the command FIFO 140. For example, data sent to the command FIFO 140 from the host 105 during the hardware co-simulation session can include an instruction that causes the command processor 125 to enter a replay mode. In replay mode, the command processor 125 can read data from the replay buffer 135. The command read from the command FIFO 140 further can indicate where within the replay buffer 135 the command processor 125 is to begin reading. The command processor 125 can read data, e.g., command template(s), beginning at the specified memory address of the replay buffer 135. The command processor 125 can construct a complete command from the command template and one or more data items read from the command FIFO 140.

Because commands fragments can be sent from the host 105 to the command FIFO 140 during the hardware co-simulation session, less information is sent via the communication channel 110 than in a conventional hardware co-simulation system. Though the example illustrated herein concerned only several commands, it should be appreciated that many more commands typically will be involved in a given hardware co-simulation session. Accordingly, the reduction in bandwidth, transactional overhead, and the like that can be attained through the use of the replay buffer 135 can be significant.

Having constructed a command or a command sequence from the replay buffer 135 and the command FIFO 140, the command processor 125 can execute the command(s). The command processor 125 can write to any designated memory address(es) of the memory map interface 155. The command processor 125 further can read from any designated memory address(es) of the memory map interface 155 to obtain data output from the DUT 150. Data read from the memory map interface 155 that is output from the DUT 150 can be obtained by the command processor 125 and loaded into the result FIFO 145. Data from the result FIFO 145 can be read by the communication interface 120 and provided to the host 105 via the communication channel 110.

Figure 2:
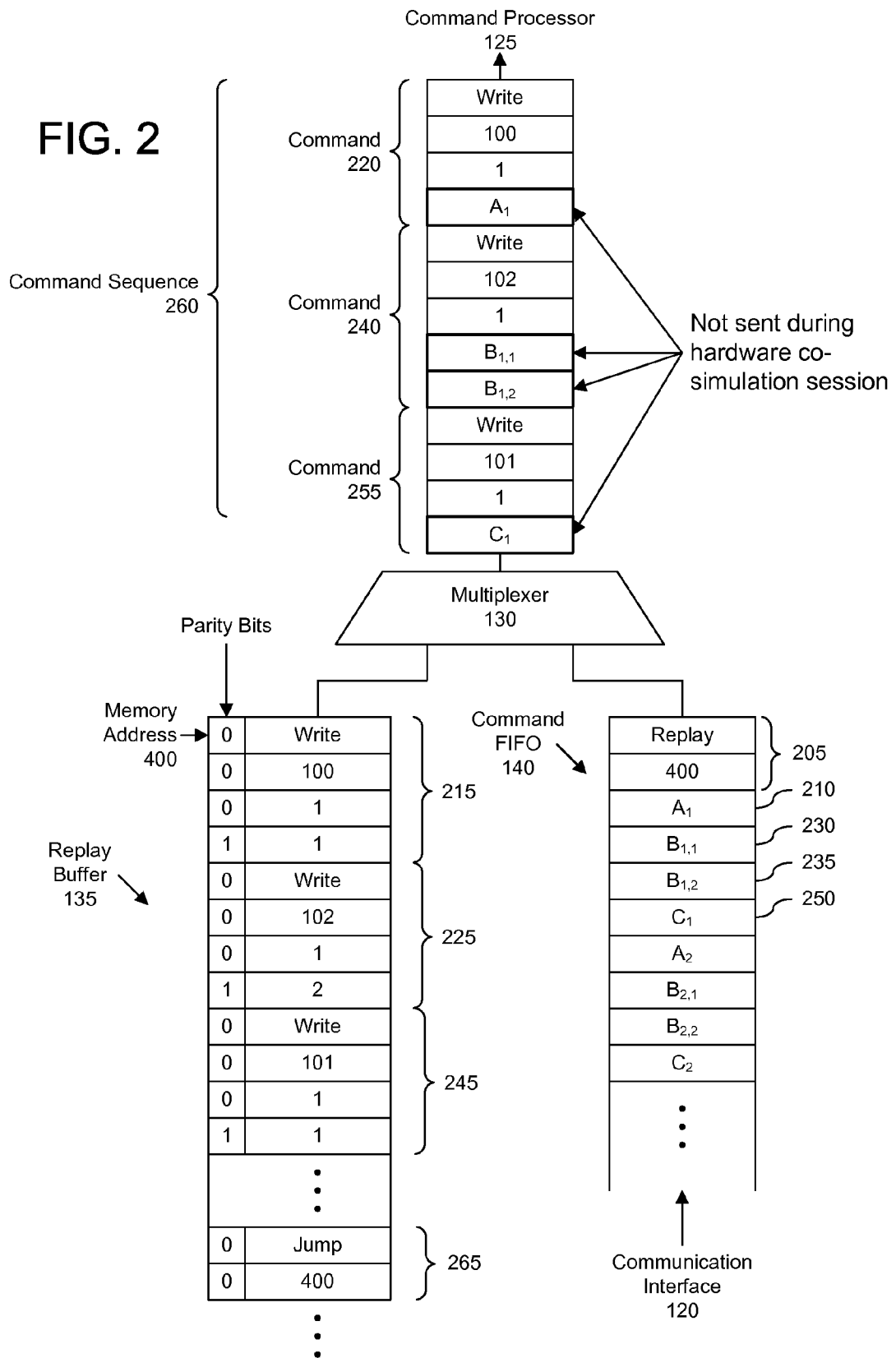
FIG. 2 is a block diagram illustrating the interaction between a replay buffer and a command first-in-first-out memory in accordance with another embodiment of the present invention.

FIG. 2 is a block diagram illustrating the interaction between the replay buffer 135 and the command FIFO 140 in accordance with another embodiment of the present invention. Prior to the start of a hardware co-simulation session, the replay buffer 135 can be loaded with data that has been determined to be recurring by the host. As noted, the data can be sent from the host to the command FIFO 140 via the communication interface 120. The command processor 125 can identify the data as data to be stored within the replay buffer 135, for example, by recognizing a particular command or other identifier within the data. The command processor 125 can write the data into the replay buffer 135. The location, e.g., address, within the replay buffer 135 to which such data is written can be specified within the data itself.

Once the hardware co-simulation session begins, the host can begin sending data to the DUT. The communication interface 120 can read data such as complete commands and command fragments from the host and write such information within the command FIFO 140 as shown. For purposes of illustration, it can be assumed that a hardware co-simulation session has begun and that the replay buffer 135 and the command FIFO 140 are loaded with data as shown. Further, the command processor (not shown) can be operating in a normal mode where data is read from the command FIFO 140.

Accordingly, the next data item to be read by the command processor 125 from the command FIFO 140 will be the replay command 205. The replay command 205 can have the structure <replay opcode><replay buffer memory address>. In this case, the "Replay" opcode instructs the command processor 125 to enter a mode in which command templates will be read from the replay buffer 135. The replay buffer memory address, in this case 400, tells the command processor the particular memory address of the replay buffer 135 from which data should be read.

Responsive to the "Replay" command, the command processor begins reading the replay buffer 135 at memory address 400. The command processor reads a command template 215 beginning at memory address 400 in the replay buffer 135. The command template 215, in this case a "Write" command template, has a structure of <opcode><memory address (data port)><data length><symbol>. In this example, the command template 215 is "Write, 100, 1, 1." The command template 215 indicates that a data item is to be written to memory address (data port) 100 of the memory map interface. The data item to be written has a data length of one.

The last operand of the "Write" command 215, in this case "1," is a symbol as indicated by a parity bit. Within the replay buffer 135, a parity bit can be included for each entry. The parity bit indicates whether the value to follow in the replay buffer 135 is a symbol. Each symbol in the replay buffer 135 is indicated with a parity bit of "1." By comparison, opcodes and operands specified within the various command templates that do not cause the command processor to read from the command FIFO 140 each have a parity bit of "0."

The word "symbol," as used herein, can be a data element of a command template that indicates a number of data items to be read from the command FIFO 140 to complete the command template to which the symbol belongs. Rather than specifying data explicitly within the command template, the symbol can be used in place of that data to instruct the command processor to obtain data needed to form a complete command from the command FIFO 140. This not only can reduce the amount of data that is exchanged between the host and the PLD during hardware co-simulation, but also allows data to be dynamically determined in that the host can dynamically calculate values and send such values to the command FIFO 140 during hardware co-simulation.

Continuing with exemplary command template 215, the symbol informs the command processor. The symbol indicates that the data to be written to the DUT is to be read from the command FIFO 140. The data obtained from the command FIFO 140 is used to complete command template 215 and form a complete command. The single item of data to be read will be the next data item in the command FIFO 140, e.g., $A_1$ within entry 210.

The command processor reads command template 215 from the replay buffer 135 and data item $A_1$ in entry 210 from the command FIFO 140, as enumerated by command template 215. Command template 215 and data item $A_1$ are combined to form a complete command 220, which can be executed by the command processor during the hardware co-simulation session. It should be appreciated that since command template 215 is loaded prior to commencement of the hardware co-simulation session, only the replay command 205 and data item $A_1$ need be transmitted during the hardware co-simulation session, thereby reducing the amount of data that needs to be sent during the hardware co-simulation session.

As the command processor is still in replay mode, the command processor can return to reading from the replay buffer 135. The command processor further can advance to a next read memory address of the replay buffer 135 corresponding to command template 225 after reading command template 215. Command template 225 is another "Write" command template. Command template 225, however, includes a symbol as an operand that instructs the command processor to retrieve two data items from command FIFO 140. Accordingly, the command processor will read the next two data items, e.g., $B_{1,1}$ and $B_{1,2}$ corresponding to entries 230 and 235 respectively. When data items $B_{1,1}$ and $B_{1,2}$ are combined with command template 225, the complete command 240 is output from the multiplexer 130 and provided to the command processor.

Still in replay mode after reading data items $B_{1,1}$ and $B_{1,2}$, the command processor can instruct multiplexer 130 to read the next command template 245 from replay buffer 135. Command template 245 is another "Write" command template having a symbol operand that instructs the command processor to read one data item from the command FIFO 140. Accordingly, data entry 250, including data item $C_1$, which is the next sequential entry, can be read. When command template 245 is joined with data item $C_1$ through the multiplexer 130, the complete command 255 is formed. The commands 220, 240, and 255 can form a command sequence 260. Of the data forming command sequence 260, only data items $A_1$, $B_{1,1}$, $B_{1,2}$, and $C_1$ are sent from the host to the PLD during the hardware co-simulation session. The other portions of the command sequence were loaded into the replay buffer 135 prior to the start of the hardware co-simulation session and read out of the replay buffer 135 during the hardware co-simulation session.

While still in replay mode, the command processor can continue to the next command template or word. At some point, the command processor can read a "Jump" command 265. The jump command 265 can be an explicit command, rather than a command template. Jump command 265 can instruct the command processor to jump to the memory address of the replay buffer that is specified, e.g., memory address 400. In this case, further commands can be created by utilizing the same sequence of command templates, but with different data items, e.g., $A_2$, $B_{2,1}$, $B_{2,2}$, and $C_2$, corresponding to the next set of data items in command FIFO 140.

In one embodiment, the command processor can continue operating in replay mode until such time that a command is sent from the host and loaded into the command FIFO 140 that, when executed by the command processor, instructs the command processor to enter normal operating mode. In that case, the command processor can begin to read entire commands and/or command sequences from the command FIFO 140.

Figure 3:
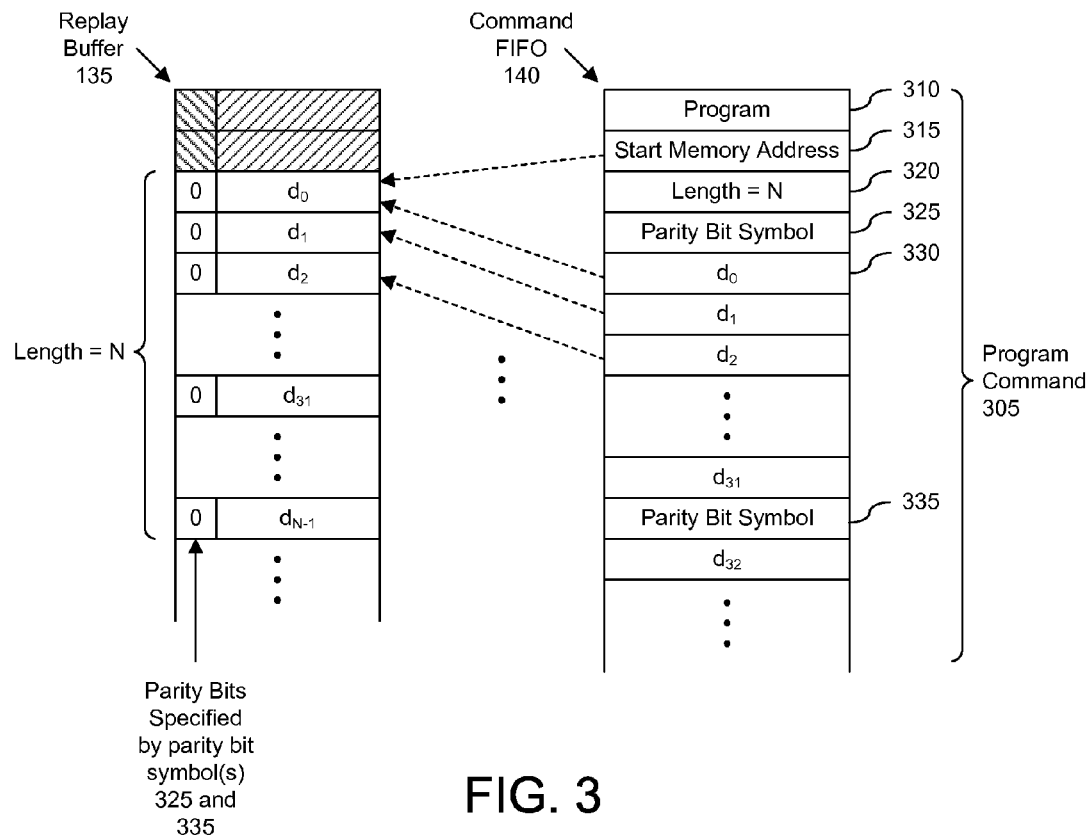
FIG. 3 is a second block diagram illustrating a command structure for dynamically reprogramming the replay buffer in accordance with another embodiment of the present invention.

FIG. 3 is a second block diagram illustrating a command structure for dynamically reprogramming the replay buffer 135 in accordance with another embodiment of the present invention. The replay buffer 135 can be reprogrammed dynamically during a hardware co-simulation session. Dynamic reprogramming of the replay buffer 135 can be performed through the use of a "Program" command 305, which can be sent by the host to the command FIFO 140. Responsive to receiving the program command 305, the command processor can change the contents of the replay buffer 135 at or during runtime, e.g., during a hardware co-simulation session.

The host can issue the program command 305 to the command FIFO 140. The program command 305 can include a "Program" opcode 310, an operand specifying a start memory address 315 of the replay buffer 135, followed by one or more command templates to be written beginning at the specified memory address 315 of the replay buffer 135. Any parity bits to be written to the replay buffer 135 also will be sent as part of the program command 305 to indicate symbols of the command template. Operand 320 can indicate the length of the data that is to be written to the replay buffer 135, e.g., indicating the number of data items "N."

For purposes of illustration, the command FIFO 140 can be assumed to have 32 bit word entries. It should be appreciated that the command FIFO 140 can be configured to have sizes other than 32 bits depending upon the memory resources available on the PLD. In this example, the program command 305 can include groupings of up to 32 entries 330, e.g., data items $d_0$-$d_{31}$, in addition to a parity bit symbol 325. The parity bit symbol 325 can be a 32 bit word that specifies one parity bit for each of the 32 entries 330 of a group to be written to the replay buffer 135. For example, the parity bit symbol 325 can specify one parity bit for each of data items $d_0$-$d_{31}$ of a group. As shown, however, the program command 305 can include one or more groups of 32 entries. An additional parity bit symbol 335 can be included for each additional group of up to 32 entries. The length 320 can indicate the total number of data items to be written to the replay buffer 135, exclusive of parity bit symbols 325 and 335. The length 320 further does not reflect other items of information that will not be written to the replay buffer 135 such as operands 315, 320, or opcode 310.

When the command processor is operating in the replay mode, the command processor must be interrupted for the programming process to take place. The command processor must enter normal mode, e.g., read from the command FIFO 140, prior to dynamically writing to the replay buffer 135. Otherwise, the program command 305 may be ignored. In one embodiment, when the command processor supports out-of-band signaling, the command processor can be placed, or forced, into normal mode through the use of an interrupt signal. When in replay mode, responsive to receiving an interrupt signal, the command processor can revert to normal mode to read the command FIFO 140 and read the program command 305.

Figure 4:
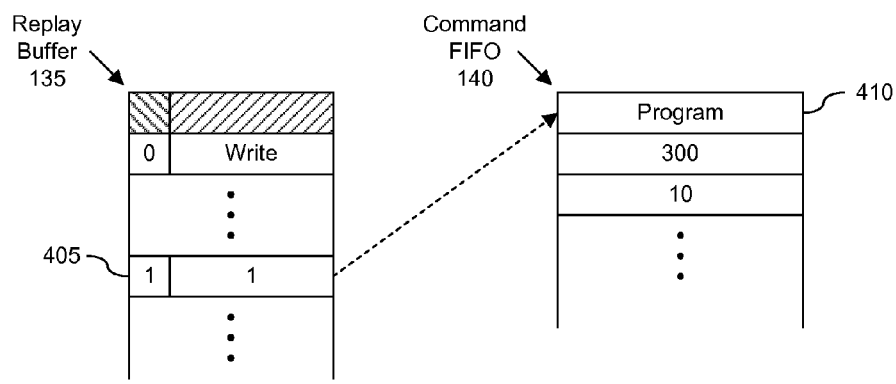
FIG. 4 is a third block diagram illustrating a technique for causing the command processor to exit a replay mode and enter a normal mode in accordance with another embodiment of the present invention.

FIG. 4 is a third block diagram illustrating a technique for causing the command processor to exit replay mode and enter normal mode in accordance with another embodiment of the present invention. The technique illustrated in FIG. 4 can be used in cases where the command processor does not support out-of-band signaling.

As shown, the replay buffer 135 can be loaded with command templates, e.g., the command template beginning with the write opcode. The command processor can be in replay mode such that the command templates are read and executed. The command processor can recognize the symbol 405 by virtue of the parity bit value of "1." The symbol 405, in this case, instructs the command processor to read one item of data from the command FIFO 140. Accordingly, the command processor can read the next data item from the command FIFO 140. In this example, the next data item to be read from the command FIFO 140 is the program opcode 410. Responsive to reading the program opcode, the command processor can resume operation in the normal operating mode and execute the program command as described herein with reference to FIG. 4.

Figure 5:
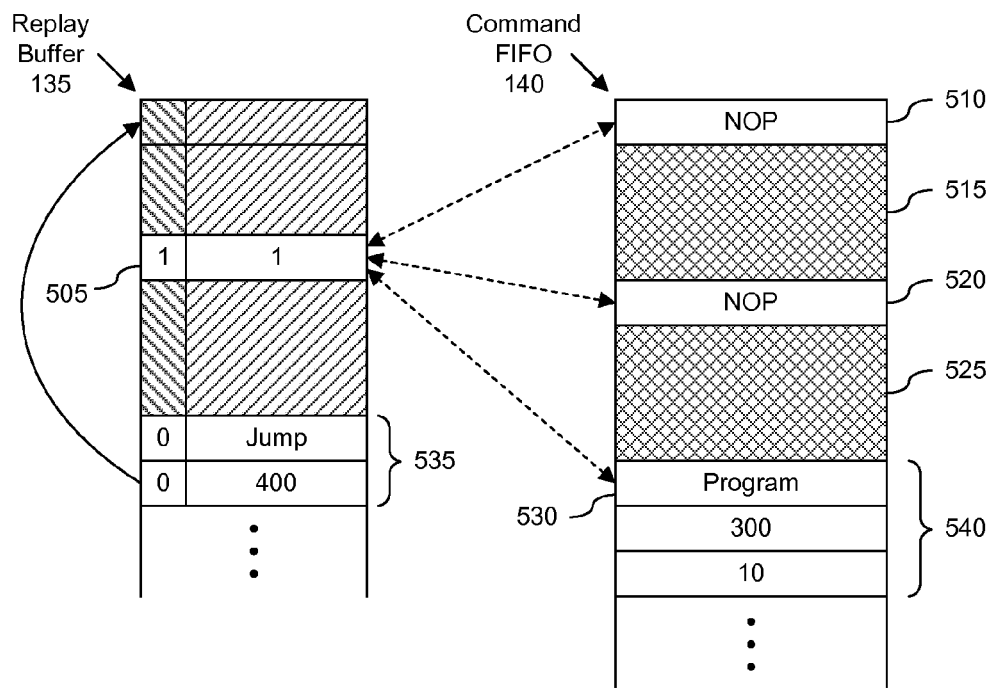
FIG. 5 is a fourth block diagram illustrating a technique for causing the command processor to exit replay mode and enter normal mode in accordance with another embodiment of the present invention.

FIG. 5 is a fourth block diagram illustrating a technique for causing the command processor to exit replay mode and enter normal mode in accordance with another embodiment of the present invention. Like the embodiments illustrated with reference to FIG. 4, FIG. 5 illustrates a technique that can be used when the command processor does not support out-of-band signaling. FIG. 5 illustrates a situation in which a symbol is used in conjunction with one or more no operations (NOPs) and the jump command to allow a sequence of command templates to be used from the replay buffer prior to exiting the replay mode.

The command processor, while operating in replay mode, can read command templates from the replay buffer 135. The command processor can read one or more command templates and symbols prior to encountering symbol 505. Responsive to reading symbol 505 having a parity bit of "1," the command processor can read the next data item from the command FIFO 140. In this case, the next data item in the command FIFO 140 is NOP 510. Accordingly, the command processor takes no action and returns to read from the next memory location in the replay buffer 135. The command processor reads jump command 535, causing the command processor to loop back to memory address 400 as indicated by the operand of jump command 535. That is, the command processor sets the read memory address of the replay buffer 135 to the read memory address specified by the operand of the jump command.

After looping back to memory address 400 of the replay buffer 135, the command processor again will execute the write command template and any other command templates to follow. The data items from portion 515 of the command FIFO 140 will be read and utilized. Upon reading symbol 505 again, the command processor can read from the command FIFO 140, where another strategically placed NOP 520 can be read. After the NOP 520, the command processor returns to reading the replay buffer 135 and executes the jump command 535 again to loop back to memory address 400 of the replay buffer.

Continued execution of the command templates from memory address 400 to the symbol 505 of the replay buffer will utilize any data items within a portion 525 of the command FIFO 140. When symbol 505 is encountered again within the replay buffer 135, the command processor will read the next data item from the command FIFO 140, which will be the program opcode 530. Responsive to reading the program opcode 530, the command processor can resume normal mode and execute the program command 540. The embodiment described with reference to FIG. 5 allows for a sequence of command templates to be used or repeated. When the symbol causes the command processor to read a NOP from the command FIFO 140, the command processor remains in replay mode. When an opcode other than a NOP, e.g., a program opcode, is read, the command processor can exit replay mode and enter normal mode to execute the opcode.

Figure 6:
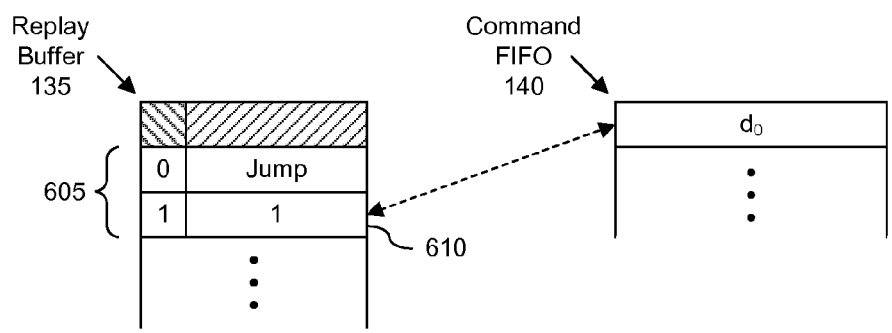
FIG. 6 is a fifth block diagram illustrating a technique for dynamically specifying a memory location for a jump command in accordance with another embodiment of the present invention.

FIG. 6 is a fifth block diagram illustrating a technique for dynamically specifying a memory location for a jump command 605 in accordance with another embodiment of the present invention. FIG. 6 illustrates a situation in which the target memory address for jump command 605 is specified through the use of a symbol. That is, operand 610 is a symbol indicated by the parity bit value of "1."

Accordingly, rather than explicitly specifying a memory address of the replay buffer 135 to which the command processor should jump, operand 610 indicates that the target jump memory address is to be obtained from the command FIFO 140. This allows the host to dynamically compute or determine such a memory address and transmit the memory address to the command FIFO 140, where it can be read and used as the jump command operand. In this case, responsive to reading symbol 610, the command processor can read value $d_0$ from the command FIFO 140 and use value $d_0$ as the memory address of the replay buffer 135 to which the command processor will jump or begin reading.

Figure 7:
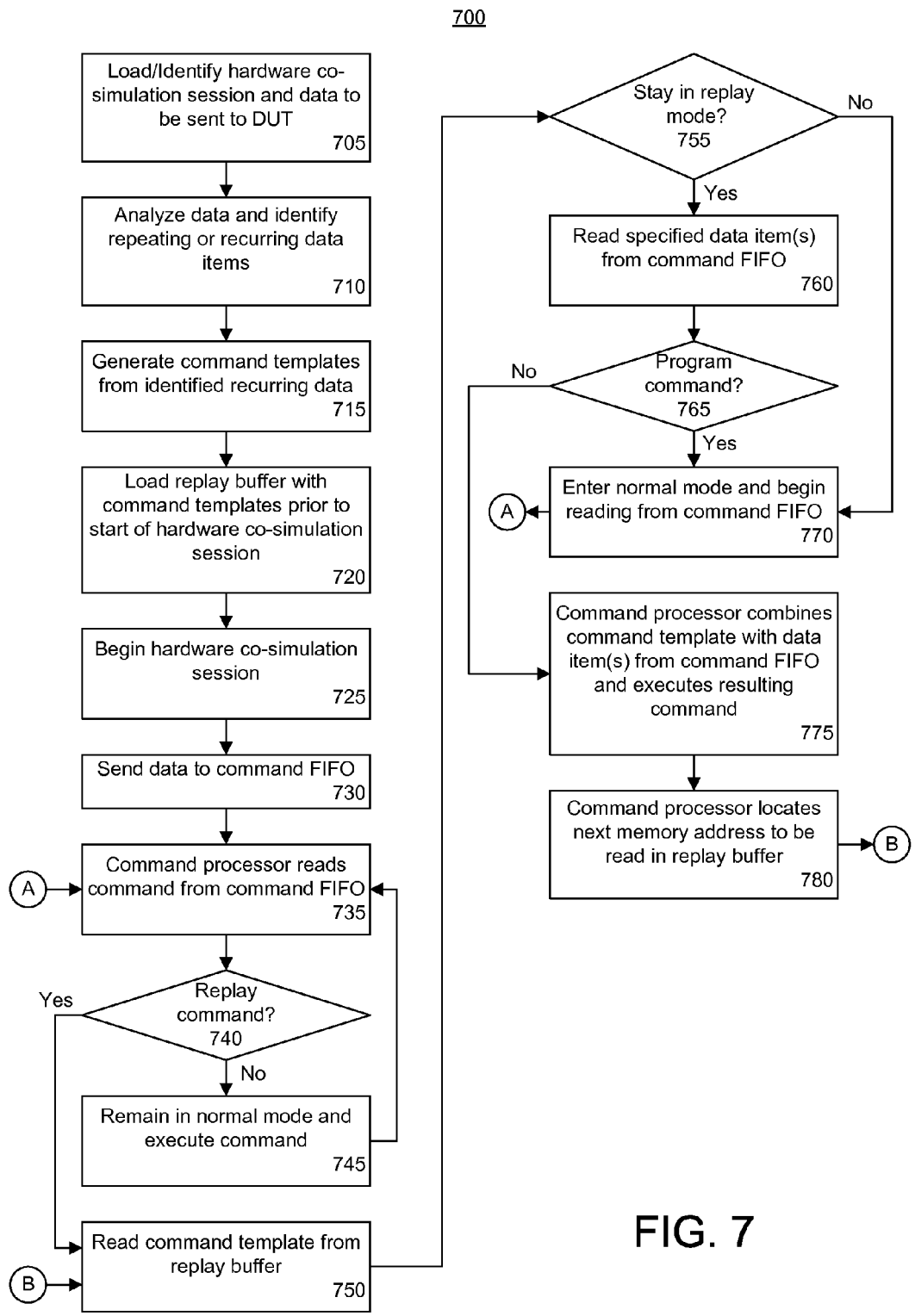
FIG. 7 is a flow chart illustrating a method of operation for the hardware co-simulation system described herein in accordance with another embodiment of the present invention.

FIG. 7 is a flow chart illustrating a method 700 of operation for the hardware co-simulation system described herein in accordance with another embodiment of the present invention. The method 700 can be implemented using a system as described with reference to FIG. 1, which is capable of generating and executing the command structures described with reference to FIGS. 2-6. The method 700 can begin in step 705 where a hardware co-simulation session can be loaded within and/or identified by the host. The hardware co-simulation session, though not started, can specify the various data that will be sent to the DUT during the hardware co-simulation session. For example, the various commands including opcodes and operands, will be known prior to the start of the hardware co-simulation session and can be identified.

In step 710, prior to the start of the hardware co-simulation session, the host can analyze the data that will be sent to the DUT during the hardware co-simulation session and identify any repeating and/or recurring patterns of command sequences, commands, opcodes, and/or operands. In step 715, prior to the hardware co-simulation session, the host can create one or more command templates corresponding to the identified recurring data. In step 720, the host can transmit the command templates to the PLD. The command templates can be loaded, or preloaded, into the replay buffer. As noted, the command templates can be loaded within the replay buffer prior to the start of the hardware co-simulation session.

In step 725, the hardware co-simulation session can begin. In step 730, the host can begin sending data to the command FIFO of the PLD. The command processor can begin the hardware co-simulation session operating in normal mode. In step 735, the command processor can read a command from the command FIFO.

In step 740, the command processor can determine whether the command is a replay command. If so, method can continue to step 750, where the command processor can enter replay mode. If the command is not a replay command, the method can continue to step 745, where the command processor remains in normal mode. Further, in step 745, the command can be executed. It should be appreciated that the command may be a conventional command causing the command processor to write data to the DUT and/or read data from the DUT. The command being executed also can be a program command as described herein, which results in dynamic reprogramming or writing to the replay buffer during the hardware co-simulation session.

Continuing with step 750, the command processor, in replay mode, can read a command template from the replay buffer. In step 755, the command processor can determine whether to remain in replay mode, where data is retrieved from the command FIFO according to the operand(s) of the command template read from the replay buffer, or whether to exit replay mode and enter normal mode. More particularly, the command processor can determine whether the command template includes a symbol indicating that replay mode has ended or that replay mode is to continue. If, for example, the symbol has a value greater than zero, replay mode can continue and one or more data items can be read from the command FIFO. In that case, the method can proceed to step 760. If the command template specifies a symbol having a value of "0," indicating that replay mode has ended and no data items are actually to be read from the command FIFO, the method can continue to step 770, where the command processor can exit replay mode, enter normal mode, and begin reading commands from the command FIFO.

In step 760, the number of data items to be obtained from the command FIFO, as specified by the command template, can be read. In step 765, the command processor can determine whether one of the data items read from the command FIFO is a program command, e.g., a "program" opcode. If so, the method can continue to step 775, where the command processor can enter normal mode and begin reading data from the command FIFO. The method can loop back to step 735, where the program command can be executed.

If the data items read from the command FIFO do not include a "program" opcode, the method can proceed to step 775. In step 775, the command template, as read from the replay buffer, can be combined with the data item(s) read from the command FIFO. Accordingly, the resulting command can be executed. In step 780, the command processor can locate the next memory address to be read in the replay buffer. The next memory address can be the next sequential memory address. If the command template specified a jump command, the next memory address can be the memory address specified as the operand of the jump command.

It should be appreciated that the method can terminate at any time responsive to a host request or when no further data remains to be provided from the host to the PLD and the replay buffer and command FIFO are exhausted. The embodiment illustrated with respect to FIG. 7 does not include aspects involving the command processor receiving out-of-band-signaling for interrupts causing the command processor to exit replay mode and enter normal mode. Those skilled in the art will appreciate that if the command processor is enabled to receive such interrupts, that such signals can be generated virtually any time during hardware co-simulation to cause the command processor to exit replay mode and return to normal mode.

The embodiments disclosed herein provide methods and systems for hardware co-simulation. The inventive arrangements can significantly reduce the amount of data that is transmitted between the host and the PLD by utilizing a replay buffer. The replay buffer further can be dynamically programmed during the hardware co-simulation session. The embodiments disclosed herein further do not require any modification to the DUT, e.g., the user design being tested, and are transparent to end users.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and computer instructions.

Embodiments of the present invention can be realized in hardware, software, or a combination of hardware and software. The embodiments can be realized in a centralized fashion in one data processing system or in a distributed fashion where different elements are spread across several interconnected data processing system. Any kind of data processing system or other apparatus adapted for carrying out the methods described herein is suited. A typical combination of hardware and software can be a general-purpose computer system with a computer program that, when being loaded and executed, controls the computer system such that it carries out the methods described herein.

Embodiments of the present invention further can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. For example, computer usable program code can include hardware description language files, a netlist, or a bitstream, each of which, with appropriate processing, can be used to program a PLD and instantiate components as described herein. Examples of computer-usable or computer-readable media can include, but are not limited to, optical media, magnetic media, computer memory, one or more portions of a wired or wireless network through which computer-usable program code can be propagated, or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. An integrated circuit configured for hardware co-simulation comprising:
    a command processor;
    a replay buffer coupled to the command processor and storing at least one command template, wherein each command template specifies an incomplete command;
    a command first-in-first out (FIFO) memory storing complementary data for completion of the command template; and
    a multiplexer coupled to the command processor, the replay buffer, and the command FIFO, wherein the multiplexer, under control of the command processor, selectively provides data from the replay buffer or the command FIFO to the command processor,
    wherein the command processor, responsive to a replay command read during a hardware co-simulation session, enters a replay mode, obtains the command template from the replay buffer, obtains the complementary data from the FIFO memory according to a symbol read from the command template, and forms a complete command by joining the command template with the complementary data.

2. The integrated circuit of claim 1, wherein the replay buffer is a random access memory.

3. The integrated circuit of claim 1, wherein the command processor advances a read memory address of the replay buffer after reading a command template from the replay buffer.

4. The integrated circuit of claim 1, wherein the command processor, responsive to reading a jump command within the replay buffer, sets a read memory address of the replay buffer to a memory address specified by the jump command.

5. The integrated circuit of claim 1, wherein, responsive to receiving a program command from a host system during the hardware co-simulation session, the command processor stores at least one command template specified by the program command beginning at a memory address of the replay buffer that is specified by the program command.

6. The integrated circuit of claim 1, wherein the command processor identifies the symbol according to a parity bit and retrieves a number of data items specified by the symbol from the command FIFO memory.

7. The integrated circuit of claim 1, wherein the command processor, responsive to determining that the symbol specifies that no data is to be obtained from the command FIFO, exits replay mode and enters normal mode, wherein a next command to be read during hardware co-simulation is read from the command FIFO.

8. The integrated circuit of claim 1, wherein the command processor receives out-of-band signals, wherein the command processor, responsive to receiving an out-of-band signal, enters normal mode, wherein a next command to be read during hardware co-simulation is read from the command FIFO.

9. A method of performing hardware co-simulation using an integrated circuit and a host data processing system (host), comprising:
    identifying recurring data that is to be sent from the host to the integrated circuit;
    programming a replay buffer within the integrated circuit with at least one command template generated from the recurring data, wherein each command template is an incomplete command;
    starting the hardware co-simulation session;
    responsive to detecting a replay command from the host, reading the command template from the replay buffer and at least one data item from a command first-in-first-out (FIFO) memory;
    forming a complete command by joining the command template and the data item; and
    outputting the complete command.

10. The method of claim 9, wherein identifying recurring data comprises identifying at least one of an op-code or an operand that is to be sent from the host to the device under test (DUT) more than one time during the hardware co-simulation session.

11. The method of claim 9, further comprising loading at least one new command template into the replay buffer during the hardware co-simulation session.

12. The method of claim 11, wherein loading at least one new command template comprises:
    receiving a program command from the host during the hardware co-simulation session; and
    storing a command template specified by the program command beginning at a memory address of the replay buffer that is specified by the program command.

13. The method of claim 9, wherein reading the command template from the replay buffer and at least one data item from a command FIFO memory comprises:
    identifying a symbol within the command template according to a parity bit; and
    retrieving a number of data items from the command FIFO as specified by the symbol.

14. The method of claim 9, wherein reading the command template from the replay buffer and at least one data item from a command FIFO memory comprises:
    identifying a symbol within the command template according to a parity bit;
    determining that the symbol specifies a value of zero; and
    responsive to determining that the symbol specifies a value of zero, exiting replay mode and entering normal mode, wherein a next command to be executed is read from the command FIFO.

15. A non-transitory computer-readable medium comprising computer-usable program code that, when loaded into an integrated circuit, configures the integrated circuit to implement a method of performing hardware co-simulation, the method comprising:

Instantiating a command processor;

Instantiating a replay buffer storing at least one command template, wherein each command template specifies an incomplete command;

Instantiating a command first-in-first out (FIFO) memory storing complementary data for completion of the command template; and Instantiating a multiplexer coupled to the command processor, the replay buffer, and the command FIFO, wherein the multiplexer, under control of the command processor, selectively provides data from the replay buffer or the command FIFO to the command processor, wherein the command processor, responsive to a replay command read during a hardware co-simulation session, enters a replay mode, obtains the command template from the replay buffer, obtains the complementary data from the FIFO memory according to a symbol read from the command template, and forms a complete command by joining the command template with the complementary data.

16. The non-transitory computer-readable medium of claim 15, wherein, responsive to receiving a program command from a host system during the hardware co-simulation session, the command processor stores at least one command template specified by the program command beginning at a memory address of the replay buffer that is specified by the program command.

17. The non-transitory computer-readable medium of claim 15, wherein the command processor identifies the symbol according to a parity bit and retrieves a number of data items specified by the symbol from the command FIFO memory.

18. The non-transitory computer-readable medium of claim 15, wherein the command processor, responsive to determining that the symbol specifies that no data is to be obtained from the command FIFO, enters normal mode, wherein a next command to be read during hardware co-simulation is read from the command FIFO.

19. The non-transitory computer-readable medium of claim 15, wherein the command processor receives out-of-band signals, wherein the command processor, responsive to receiving an out-of-band signal, enters normal mode, wherein a next command to be read during hardware co-simulation is read from the command FIFO.

20. The non-transitory computer-readable medium of claim 15, wherein the command processor, responsive to reading a jump command within the replay buffer, sets a read memory address of the replay buffer to a memory address specified by the jump command.

\* \* \* \* \*